US008896044B1

(12) United States Patent
Byun

(10) Patent No.: US 8,896,044 B1
(45) Date of Patent: Nov. 25, 2014

(54) ORGANIC LIGHT EMITTING DIODE DISPLAY

(71) Applicant: Samsung Display Co., Ltd., Gyeonggi-Do (KR)

(72) Inventor: Ki-Yeol Byun, Gyeonggi-Do (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 0 days.

(21) Appl. No.: 14/039,795

(22) Filed: Sep. 27, 2013

(30) Foreign Application Priority Data

May 9, 2013 (KR) ........................ 10-2013-0052583

(51) Int. Cl.
*H01L 27/32* (2006.01)
*H01L 51/52* (2006.01)

(52) U.S. Cl.
CPC ........ *H01L 27/3262* (2013.01); *H01L 27/3265* (2013.01); *H01L 51/5203* (2013.01)
USPC ............ 257/296; 257/306; 438/250; 438/253

(58) Field of Classification Search
CPC ............ H01L 27/3262; H01L 27/3265; H01L 51/5203
USPC ........................... 257/296, 306; 438/250, 253
See application file for complete search history.

(56) References Cited

U.S. PATENT DOCUMENTS

| | | | | |
|---|---|---|---|---|
| 6,787,832 | B2 * | 9/2004 | Schmid et al. | 257/295 |
| 7,242,024 | B2 * | 7/2007 | Yamazaki et al. | 257/72 |
| 7,542,354 | B2 | 6/2009 | Chun et al. | |
| 8,144,086 | B2 * | 3/2012 | Lee et al. | 345/82 |
| 2001/0055008 | A1 * | 12/2001 | Young et al. | 345/204 |
| 2011/0031491 | A1 * | 2/2011 | Yamazaki et al. | 257/43 |
| 2013/0075766 | A1 * | 3/2013 | Chang et al. | 257/88 |
| 2014/0048861 | A1 * | 2/2014 | Shibata et al. | 257/296 |
| 2014/0048883 | A1 * | 2/2014 | Ukeda et al. | 257/347 |

FOREIGN PATENT DOCUMENTS

| | | |
|---|---|---|
| JP | 2011-114346 | 6/2011 |
| KR | 1020100055249 | 5/2010 |

* cited by examiner

*Primary Examiner* — Allan R Wilson
(74) *Attorney, Agent, or Firm* — F. Chau & Associates, LLC

(57) ABSTRACT

An organic light emitting diode (OLED) display is provided. The OLED displayer includes a capacitor electrode disposed on a substrate. An insulation layer is disposed on the capacitor electrode. A first active layer is disposed on the insulation layer. The first active layer includes a first doped area, a second doped area, and a first channel area disposed between the first doped area and the second doped area. A first gate electrode is disposed on the first channel area of the first active layer. An organic light emitting diode is disposed on the substrate. The organic light emitting diode is electrically coupled to the second doped area of the first active layer. A driving power source line is disposed on the substrate and electrically coupled to the first doped area of the first active layer and to the capacitor.

14 Claims, 4 Drawing Sheets

1000
First direction
Second direction
SUB
ELVDD
ELVSS
PE
ELVDDL
ELVDDL
DD
Dm
D2
D1
DW
A
GW
S1
S2
Sn
GD

ORGANIC LIGHT EMITTING DIODE DISPLAY

CROSS-REFERENCE TO RELATED APPLICATION

This application claims priority under 35 U.S.C. §119 to Korean Patent Application No. 10-2013-0052583, filed on May 9, 2013 in the Korean Intellectual Property Office, the disclosure of which is incorporated by reference herein in its entirety.

TECHNICAL FIELD

The present invention relates to an organic light emitting diode (OLED) display, more particularly, to an OLED display including a capacitor.

DESCRIPTION OF RELATED ART

Organic light emitting diode displays are used to create digital displays in electronic devices such as mobile phones or digital televisions. The organic light emitting diode displays include a light-emitting diode having a layer of organic compound that emits light in response to an electric current. Without the need for an additional light source, the organic light emitting diode displays may display an image and thus they may be made with a very thin profile and lighter in weight. Further, the organic light emitting diode displays have high-quality characteristics such as low power consumption, high luminance, and a high response speed.

SUMMARY

According to an exemplary embodiment of the present invention, an organic light emitting diode (OLED) display includes a capacitor electrode, a first thin film transistor, and an organic light emitting diode. The first thin film transistor is disposed on the capacitor electrode. The first thin film transistor includes a first gate electrode and a first active layer including a first doped area, a second doped area, and a first channel area disposed between the first doped area and the second doped area. The first gate electrode is disposed on the first channel area. The first doped area is electrically coupled to the capacitor electrode. The first channel area is disposed on the capacitor electrode. An overlapped area of the first channel area and the capacitor electrode forms a capacitor. An organic light emitting diode is connected to the second doped area of the first thin film transistor.

According to an exemplary embodiment of the present invention, an organic light emitting diode (OLED) display includes a capacitor electrode disposed on a substrate. An insulation layer is disposed on the capacitor electrode. A first active layer is disposed on the insulation layer. The first active layer includes a first doped area, a second doped area, and a first channel area disposed between the first doped area and the second doped area. A first gate electrode is disposed on the first channel area of the first active layer. An organic light emitting diode is disposed on the substrate. The organic light emitting diode is electrically coupled to the second doped area of the first active layer. A driving power source line is disposed on the substrate and electrically coupled to the first doped area of the first active layer and to the capacitor.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EMBODIMENTS

Figure 1:
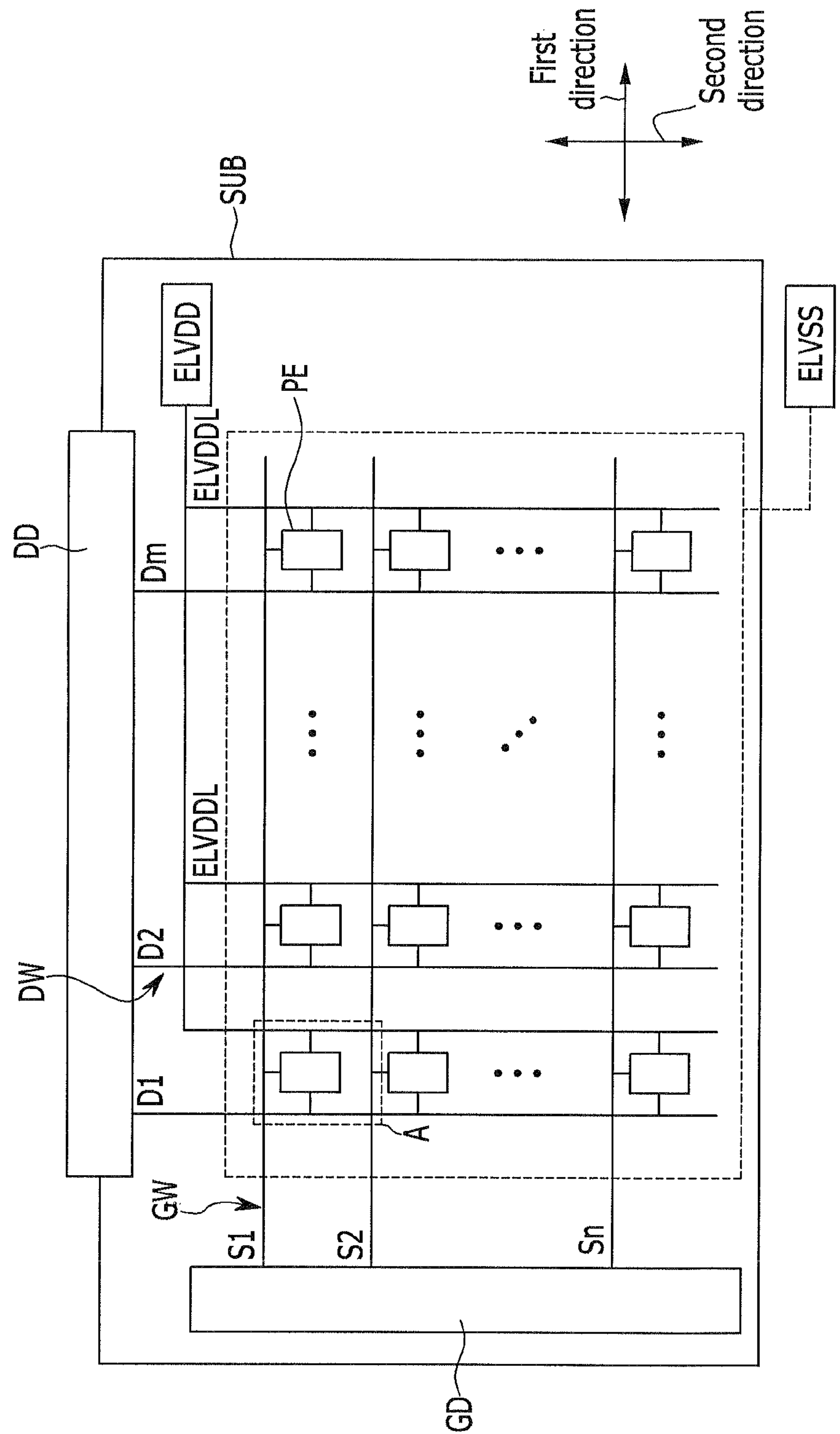
FIG. 1 shows a block diagram illustrating an OLED display according to an exemplary embodiment of the present invention.

Exemplary embodiments of the present invention will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

Hereinafter, an organic light emitting diode (OLED) display according to an exemplary embodiment of the present invention will be described with reference to FIG. 1 to FIG. 4.

FIG. 1 shows a block diagram illustrating an OLED display according to an exemplary embodiment of the present invention.

As shown in FIG. 1, a display device 1000 includes a substrate SUB, a gate driver GD, gate wires GW, a data driver DD, data wires DW, and pixels PE. Here, the pixel PE implies the minimum unit of displaying an image, and the display device 1000 displays an image through a plurality of pixels PE.

The substrate SUB is formed of a transparent insulating substrate including glass, quartz, ceramic, or plastic. However, the present invention is not limited thereto, and substrate SUB may be formed of a metallic substrate including, but is not limited to, stainless steel. In addition, when the substrate SUB is made of plastic, the display device 1000 may be flexible, stretchable, or rollable.

The gate driver GD sequentially supplies a scan signal to the gate wires GW corresponding to a control signal supplied from an external control circuit (not shown), for example, a timing controller and the like. Then, the pixels PE are selected by the scan signal and sequentially receive a data signal.

The gate wires GW are disposed on the substrate SUB and extended in a first direction. The gate wires GW include scan lines S1 to Sn connected to the gate driver GD and receive a scan signal from the gate driver GD.

The gate wires GW may include an additional scan line, an initialization power line, or a light emission control line. In this case, the display device may be an active matrix (AM)-type OLED display having a 6Transistor-2Capacitor structure.

The data driver DD supplies the data signal to a data line Dm among the data wires DW. The data signal corresponds to a control signal supplied from an outside such as a timing controller. The data signal supplied to the data line Dm is supplied to a selected pixel PE by a scan signal supplied from the scan line S1. Then, the pixel PE charges a voltage corresponding to the data signal and emits light having luminance corresponding to the charged voltage.

The data wires DW may be disposed on the gate wires GW or between the gate wires GW and the substrate SUB, and extended in a second direction that crosses the first direction. The data wires DW include data lines D1 to Dm and a driving power line ELVDDL. The data line D1 to Dm is connected to the data driver DD and receives a data signal from the data driver DD. A driving power source line ELVDDL is separated from the data line D1 to Dm and extended to the second direction, and is connected to an external first power ELVDD and receives driving power therefrom.

The pixels PE are disposed at areas where the gate wires GW and the data wires DW cross each other. The pixels PE are connected to the gate wires GW and the data wires DW. Each pixel PE includes two thin film transistors connected to the gate wires GW and the data wires DW, a capacitor, and an organic emission element connected to a second power ELVSS. The pixel PE is selected when a scan signal is supplied through the scan line S1 and thus charges a voltage corresponding to the data signal through the data line Dm and emits light with a predetermined luminance corresponding to a charged voltage. Alignment of the pixels PE will be described in detail later.

Hereinafter, a structure of the pixels PE will be described with reference to FIG. 2 and FIG. 3.

Figure 2:
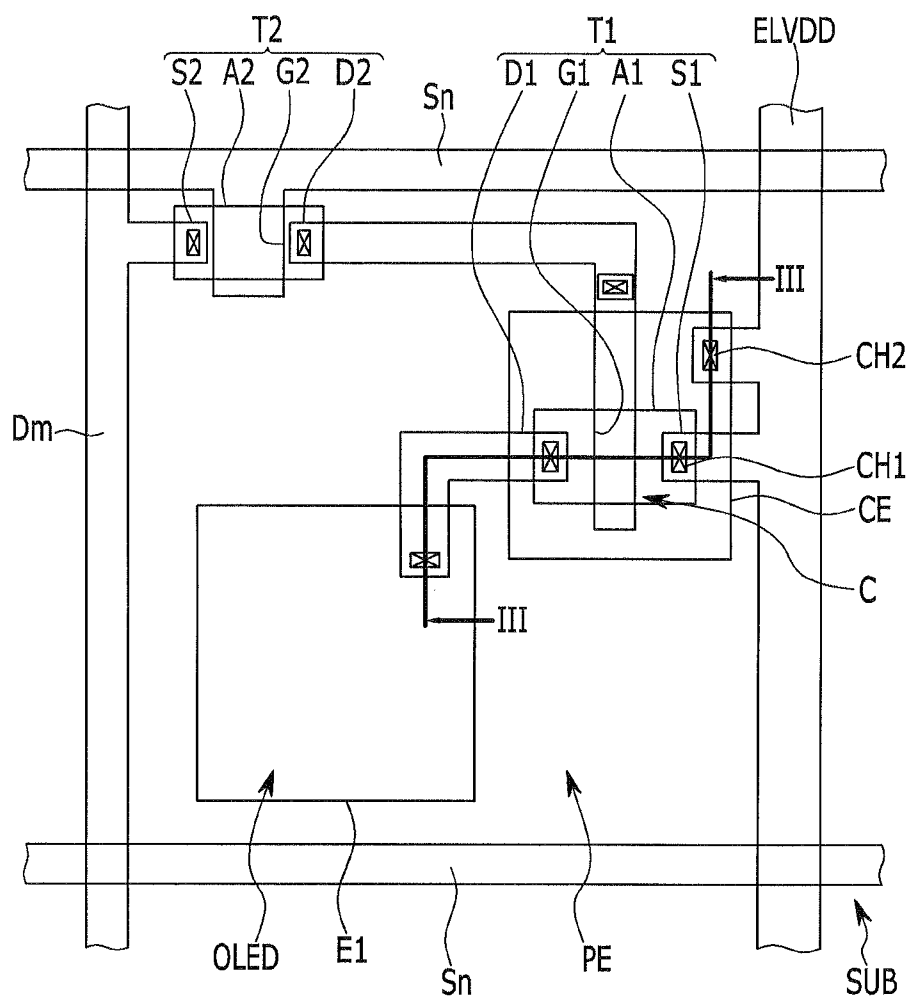
FIG. 2 is a layout illustrating the portion "A" of FIG. 1.

FIG. 2 is a layout illustrating the portion "A" of FIG. 1. FIG. 3 is a cross-sectional view of FIG. 2, taken along line III-III.

Figure 3:
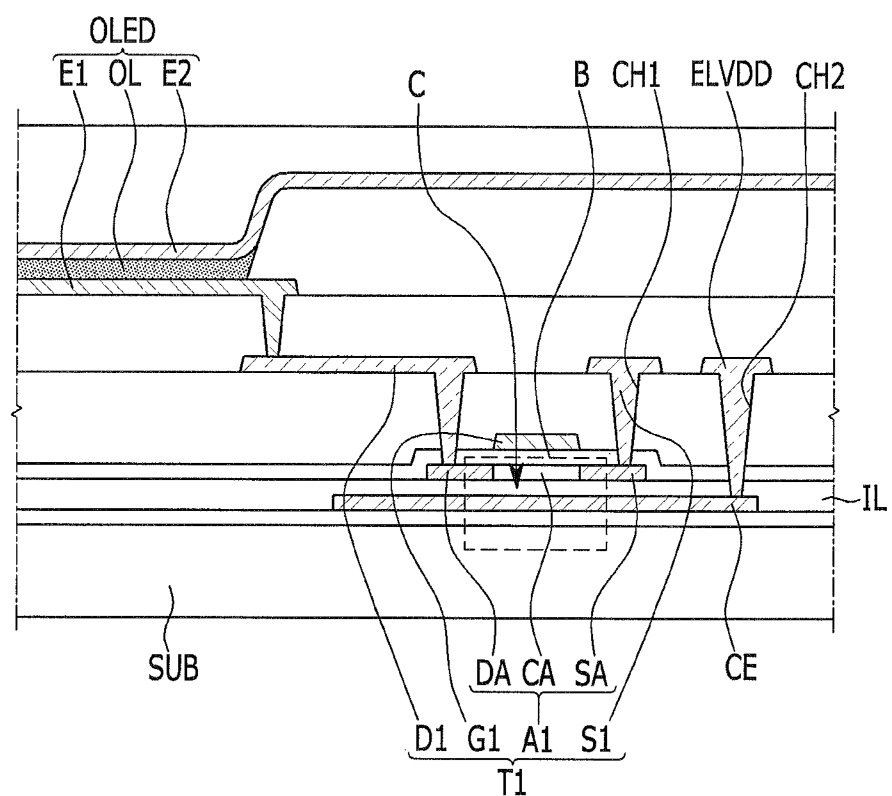
FIG. 3 is a cross-sectional view of FIG. 2, taken along line III-III.

As shown in FIG. 2 and FIG. 3, each pixel PE has a 2Tr-1Cap structure in which an organic light emitting diode (OLED), a first thin film transistor T1, a second thin film transistor T2, and a capacitor C are arranged. However, a pixel structure of the present invention is not limited thereto, and a pixel structure may include three or more thin film transistors and two or more capacitors.

The organic light emitting diode OLED is connected to the first thin film transistor T1, and includes a first electrode E1 which is an anode functioning as a hole injection electrode, a second electrode E2 which is a cathode functioning as an electron injection electrode, and an organic emission layer OL disposed between the first electrode E1 and the second electrode E2.

The first electrode E1 is a light transmissive electrode and the second electrode E2 is a light reflective electrode. For example, light emitted from the organic emission layer OL is reflected by the second electrode E2 and passes through the first electrode E1, and then is viewed from the bottom of the OLED display 1000.

Meanwhile, in an OLED display according to another exemplary embodiment of the present invention, one or more of the first electrode and the second electrode may be formed of a light transmissive electrode. For example, the first electrode is formed of a light reflective electrode and the second electrode may be formed of a light transmissive electrode, or the first electrode and the second electrode may be respectively formed of light transmissive electrodes.

The second thin film transistor T2 includes a second gate electrode G2, a second active layer A2, a second source electrode S2, and a second drain electrode D2.

The second gate electrode G2 is connected to the scan line Sn. The second active layer A2 is disposed overlapping the second gate electrode G2 corresponding to the second gate electrode G2. Lateral ends of the second active layer A2 are respectively connected to the second source electrode S2 and the second drain electrode D2. The second source electrode S2 is connected to the data line Dm. The second drain electrode D2 is separated from the second source electrode S2, interposing the second gate electrode G2 therebetween. The second drain electrode D2 is connected to the first gate electrode G1 of the first thin film transistor T1. For example, the second active layer A2 connects between the data line Dm and the first gate electrode G1.

The first thin film transistor T1 includes a first gate electrode G1, a first active layer A1, a first source electrode S1, and a first drain electrode D1.

The first gate electrode G1 is connected to the second drain electrode D2 of the second thin film transistor T2. The first gate electrode G1 is disposed on the first active layer A1, and corresponds to a channel area CA of the second active layer A2.

The first active layer A1 overlaps the first gate electrode G1 and a capacitor electrode CE of the capacitor C, and is disposed between the first gate electrode G1 and the capacitor electrode CE. The first active layer A1 connects between the driving power source line ELVDDL and the organic light emitting diode OLED, and includes a source area SA connected to the first source electrode S1, a drain area DA connected to the second source electrode S2, and the channel area CA disposed between the source area SA and the drain area DA.

The channel area CA of the first active layer A includes a P-type doped semiconductor or an N-type doped semiconductor, and the source area SA and the drain area DA respectively include impurity-doped conductors. The first active layer A1 may include polysilicon or oxide.

The first active layer A1 is disposed on the capacitor electrode CE. An insulation layer IL is disposed between the first active layer A1 and the capacitor electrode CE. The channel area CA of the first active layer A1 and the capacitor electrode CE form the capacitor C when power is supplied to the first gate electrode G1.

The first source electrode S1 and the first drain electrode D1 are separated from each other. The first gate electrode G1 is disposed between the first source electrode S1 connected to the source area SA and the first drain electrode D1 connected to the drain area DA. The first source electrode S1 is connected to the driving power source line ELVDDL, and the first drain electrode D1 is connected to the first electrode E1 which is an anode of the organic light emitting diode OLED. The first source electrode S1 is integrally formed with the driving power source line ELVDDL, and is connected to the first active layer A1 through first contact hole CH1. For example, the driving power source line ELVDDL is connected to the first active layer A1 through the first contact hole CH1.

The capacitor C includes a capacitor electrode CE and the channel area CA of the first active layer A1, the insulation layer IL disposed therebetween.

The capacitor electrode CE is connected to the first active layer A1 through the driving power source line ELVDDL, and overlaps the first gate electrode G1, interposing the first active layer A1 therebetween. The capacitor electrode CE forms the channel area CA and the capacitor C of the first active layer A1 when power is supplied to the first gate electrode G1. The capacitor electrode CE is a conductor including amorphous silicon doped with an impurity or a polysilicon doped with an impurity. The capacitor electrode CE is connected to the driving power source line EVLDDL through a second contact hole CH2. For example, the capacitor electrode CE is connected to the driving power source line ELVDDL through the second contact hole CH2, and the driving power source line ELVDDL and the capacitor electrode CE may be connected to each other by an additional conductive material such as aluminum (Al) and silver (Ag) filled in the second contact hole CH2. The capacitor electrode CE has a larger area than the first active layer A1, but it is not restrictive. The capacitor electrode CE may have substantially the same area of the first active layer A1 or may have a smaller area than the first active layer A1.

Hereinafter, an operation of the pixels PE will be described with reference to FIG. 2 to FIG. 4.

Figure 4:
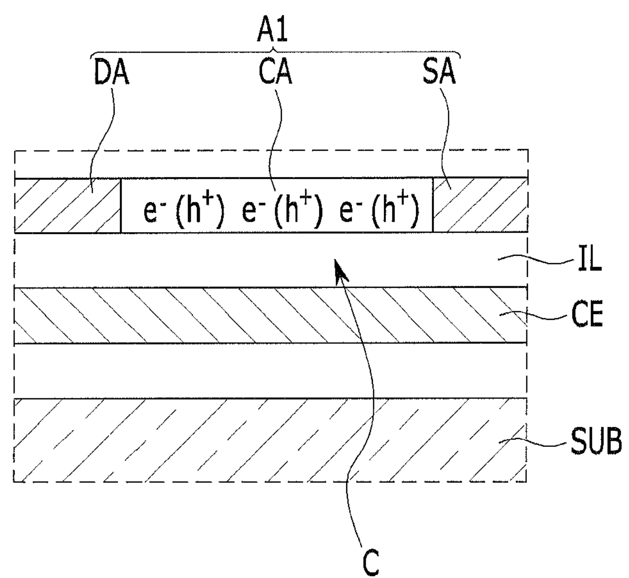
FIG. 4 is an enlarged cross-sectional view of the portion "B" in FIG. 3.

FIG. 4 is an enlarged cross-sectional view of the portion "B" in FIG. 3.

As shown in FIG. 2 to FIG. 4, first, when power is supplied to the second gate electrode G2 through the scan line Sn and thus the second thin film transistor T2 is turned on, a voltage supplied by the data line Dm is applied to each of the first gate electrode G1. The first external power ELVDD is applied to first drain electrode D1 using the driving power source line ELVDDL. The voltage difference between the first gate electrode G1 and the first drain electrode D1 generates a strong electric field such that a plurality of electron-hole pairs are generated in the channel area CA. In this case, since the channel area CA is the P-type doped semiconductor (or, the N-type doped semiconductor), electrons ($e^-$) (or, holes ($h^+$)) that do not recombine with the holes (or, electrons ($e^-$)) are accumulated in the bottom of the channel area CA. For example, a floating body effect occurs. The electron ($e^-$) layer (or, a hole ($h^+$) layer) accumulated in the bottom of the channel area CA serves as another electrode of the capacitor C so that the capacitor electrode CE and the electron ($e^-$) layer (or, a hole ($h^+$) layer) form the capacitor C and the capacitor C is charged.

For example, the capacitor electrode CE is coupled to the driving power source line ELVDDL and the first gate electrode G1 is coupled to the data line Dm through the second thin film transistor T2 and thus the electron ($e^-$) layer (or, the hole ($h^+$) layer) is accumulated at the bottom portion of the channel area CA of the first active layer A1 by the floating body effect, and accordingly, the electron (e−) layer (or, the hole (h+) layer) serves as another electrode of the capacitor C such that the capacitor C is charged.

For example, the amount of charges charged at this point is proportional to a voltage applied from the data line Dm. In addition, when the second thin film transistor T2 is in the turn-off state, the first thin film transistor T1 passes a voltage of the driving power source line ELVDDL to the organic light emitting diode OLED using the potential charged in the capacitor C. For example, the first transistor turns on when the charged potential of the capacitor C exceeds a threshold voltage of the first thin film transistor T1. Then, a voltage applied to the driving power source line ELVDDL is applied to the organic light emitting diode OLED through the first thin film transistor T1, and accordingly the organic light emitting diode OLED emits light.

As described above, in the OLED display according to the exemplary embodiment of the present invention, the capacitor electrode CE overlaps the P-type or N-type doped channel area CA of the first active layer A1 such that the channel area CA and the capacitor electrode CE form the capacitor C, and accordingly a space for the capacitor C may be minimized.

For example, since the capacitor C may be overlapped with the first active layer A1, more pixels may be disposed in a limited area. Accordingly, the OLED display 1000 may have high resolution in a limited area.

In addition, the size of the first electrode E1 may be increased, thereby maximizing the entire aperture ratio of the organic light emitting diode OLED. Further, the capacitor C of each pixel may be overlapped with the first active layer A1, and thereby increasing the size of the first electrode E1. Accordingly, display quality may be increased by maximizing an aperture ratio of a pixel.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light emitting diode (OLED) display comprising:
- a capacitor electrode;
- a first thin film transistor disposed on the capacitor electrode,
  - wherein the first thin film transistor includes a first gate electrode and a first active layer including a first doped area, a second dope area, and a first channel area disposed between the first doped area and the second doped area,
  - wherein the first gate electrode is disposed on the first channel area,
  - wherein the first doped area is electrically coupled to the capacitor electrode,
  - wherein the first channel area is disposed on the capacitor electrode, and
  - wherein an overlapped area of the first channel area and the capacitor electrode forms a capacitor; and
- an organic light emitting diode connected to the second doped area of the first thin film transistor.

2. The OLED display of claim 1, wherein the channel area of the first active layer comprises a P-type doped semiconductor or an N-type doped semiconductor.

3. The OLED display of claim 2, further comprising an insulation layer disposed between the first active layer and the capacitor electrode.

4. The OLED display of claim 3, wherein the capacitor electrode comprises amorphous silicon doped with an impurity or polysilicon doped with an impurity.

5. The OLED display of claim 1, further comprising:
- a scan line extended in a first direction;
- a data line extended in a second direction that crosses the first direction;
- a second thin film transistor including a second gate electrode, a first electrode, and a second electrode, wherein the second gate electrode is connected to the scan line, the first electrode is connected to the data line and the second electrode is connected to the first gate electrode of the first thin film transistor; and
- a driving power source line extended in the second direction at a distance from the data line and connected to both the first doped area of the first active layer and the capacitor electrode.

6. The OLED display of claim 5, wherein the driving power source line is connected to the first doped area using a first contact hole and to the capacitor electrode using a second contact hole.

7. The OLED display of claim 1, wherein the organic light emitting diode comprises:
- a first electrode electrically coupled to the second doped area of the first active layer;
- an organic emission layer disposed on the first electrode; and
- a second electrode disposed on the organic emission layer.

8. The OLED display of claim 7, wherein the first electrode is a light transmissive electrode and the second electrode is a light reflective electrode.

9. An organic light emitting diode (OLED) display comprising:
- a capacitor electrode disposed on a substrate;
- an insulation layer disposed on the capacitor electrode;
- a first active layer disposed on the insulation layer, wherein the first active layer includes a first doped area, a second doped area, and a first channel area disposed between the first doped area and the second doped area;

a first gate electrode disposed on the first channel area of the first active layer;

an organic light emitting diode disposed on the substrate, wherein the organic light emitting diode is electrically coupled to the second doped area of the first active layer; and a driving power source line disposed on the substrate and electrically coupled to the first doped area of the first active layer and to the capacitor.

10. The OLED display of claim 9, further comprising:

a scan line extended in a first direction and disposed on the substrate;

a data line extended in a second direction crossing the first direction and disposed on the substrate;

a second thin film transistor disposed on the substrate and configured to provide a data voltage supplied from the data line to the first gate electrode of the first thin film transistor in response to a signal supplied from the scan line.

11. The OLED display of claim 10, wherein the channel area of the first thin film transistor becomes a floating body having accumulated charges when the data voltage is applied to the first gate electrode.

12. The OLED display of claim 11, wherein the channel area of the first active layer is doped with P-type impurities, and wherein when the data voltage is applied to the first gate, electrons are accumulated in the channel area.

13. The OLED display of claim 11, wherein the channel area of the first active layer is doped with N-type impurities, and wherein when the data voltage is applied to the first gate, holes are accumulated in the channel area.

14. The OLED display of claim 12, wherein the channel area having the accumulated electrons, the capacitor, and the insulation layer disposed therebetween form a capacitor.

* * * * *